United States Patent [19]

Kamiya

[11] Patent Number: 5,563,683
[45] Date of Patent: Oct. 8, 1996

[54] SUBSTRATE HOLDER

[75] Inventor: Saburo Kamiya, Yokohama, Japan

[73] Assignee: Nikon Corporation, Tokyo, Japan

[21] Appl. No.: 481,157

[22] Filed: Jun. 7, 1995

Related U.S. Application Data

[63] Continuation of Ser. No. 341,898, Nov. 15, 1994, abandoned, which is a continuation of Ser. No. 92,447, Jul. 14, 1993, abandoned.

[30] Foreign Application Priority Data

Jul. 20, 1992 [JP] Japan .................................. 4-191765

[51] Int. Cl.$^6$ ..................................... G03B 27/60
[52] U.S. Cl. .................... 355/53; 355/73; 355/76
[58] Field of Search ..................... 355/53, 73, 76, 355/87, 91

[56] References Cited

U.S. PATENT DOCUMENTS

| | | | |
|---|---|---|---|
| 4,522,489 | 6/1985 | Bouwer | 355/73 |
| 4,655,584 | 4/1987 | Tanaka et al. | 355/53 |
| 4,888,488 | 12/1989 | Miyake | 250/492.1 |

*Primary Examiner*—M. L. Gellner
*Assistant Examiner*—Daniel P. Malley
*Attorney, Agent, or Firm*—Shapiro and Shapiro

[57] ABSTRACT

A substrate holder is provided with two kinds of grooves (clearances) in the absorbing surface thereof. One kind of groove is made of a suitable depth so as to be able to quickly exhaust air and reduce pressure to thereby vacuum mount a substrate, and the other kind of groove is formed with a very small depth within such a range that there is no influence of dust being interposed between the holder and the substrate, in order to better the heat conduction between the substrate and the substrate holder. In addition, the area of the latter is made large as compared with the area of the former.

26 Claims, 4 Drawing Sheets

SUBSTRATE HOLDER

This a continuation of application Ser. No. 08/341,898 filed Nov. 15, 1994, which is a continuation of application Ser. No. 08/092,447 filed Jul. 14, 1993, both now abandoned.

BACKGROUND OF THE INVENTION

1. Field of the Invention

This invention relates to a holder incorporated in a working apparatus, an exposing apparatus or an inspecting apparatus used in relatively clean environment and vacuum which is used for mounting a substrate to be worked, a substrate to be exposed or a substrate to be inspected.

2. Related Background Art

Various holders of this kind have heretofore been proposed and put into practical use. Particularly in exposing apparatus used for the manufacture of semiconductor elements, liquid crystal display elements or the like, a holder of the vacuum mounting type has long been utilized to hold and flatten a photosensitive substrate to be exposed (a wafer or a glass plate). Some examples of the prior-art holders will hereinafter be described with reference to FIGS. 1A to 1D of the accompanying drawings.

FIG. 1A shows an example of the surface structure of a wafer holder WH1 of the oldest type, and the whole of this holder is made into a thick disc-like shape by the use of a metal, such as aluminum, or ceramics. An opening SU for center up is formed in the central portion of the holder WH1. A vertically movable center up member for raising a wafer placed thereon extends through the opening SU. The supporting surface of the wafer holder WH1 is polished so that the flatness thereof may become very high to hold the wafer flatly. Further, a plurality of (here, three) concentric vacuum grooves VC1, VC2 and VC3 are formed at suitable intervals in the supporting surface. The width and depth of these grooves are of the order of 1–2 mm. A groove VC4 for connecting the three grooves VC1, VC2 and VC3 radially thereof is formed at each suitable angle (here, 90°) in the circumferential direction. Intake holes connected to a vacuum source are formed at suitable locations in these grooves.

FIG. 1B shows the surface structure of a wafer holder WH2 conceived to eliminate the problem peculiar to the wafer holder of FIG. 1A, and as shown, a number of concentric grooves VCS are radially formed at a fine pitch in accordance with the configuration of a wafer, or a number of spiral grooves VCS are formed. The width and pitch of the grooves VCS are, for example, of the order of 1 mm and 2–3 mm, respectively. If the groove VCS are thus arranged at a fine pitch on the whole surface, the area of contact in which the protruded portion (supporting surface) between adjacent grooves contacts the back of the wafer becomes markedly smaller than in FIG. 1A. Therefore, the possibility of foreign substances (dust) being interposed between the supporting surface (protruded portion) and the back of the wafer becomes small, and even if foreign substances are interposed therebetween, the foreign substances can be expected to be eliminated toward the grooves VCS in the process of the wafer being vacuum mounted, because the grooves VCS lie at both sides of the protruded portion.

FIG. 1C shows the surface structure of a holder WH3 in which the area of contact with the back of the wafer is made still smaller than that in FIG. 1B. This holder WH3 has an annular protruded surface R1 matching the configuration of a wafer placed thereon, and an inner annular protruded surface R2 surrounding an opening SU for center up, and they are formed so as to protrude by the order of 1 to several mm relative to a concave portion BT. A plurality of pins PV each having a diameter of the order of 0.1–1 mm at the tip end thereof and contacting with the back of the wafer are two-dimensionally studded at substantially uniform intervals in the concave portion BT. Further, the tip ends of the protruded surfaces R1, R2 and pins PV of the holder WH3 are formed so as to be flush with one another at the order of 1 micron. Intake holes for vacuum application are formed in the concave portion BT, and the vacuum mounting of the wafer is effected by the whole of the interior of the concave portion BT being evacuated with the wafer placed on the holder.

FIG. 1D shows a portion of the surface of a holder on which, as in FIG. 1C, pin-like projections PV' are formed at uniform intervals and intake holes CC for evacuation are formed at the tip ends of the projections PV'. This holder has an advantage that because all of the numerous projections PV' create an adsorbing force, the annular protruded surfaces R1 and R2 for making the concave portion BT into a closed space as in FIG. 1C need not be provided.

As described above, improvements have historically been made toward a reduced area of contact with the back of the wafer. This is because when foreign substances such as dust are interposed between the supporting surface and the back of the wafer, that portion of the wafer surface (exposed surface) becomes bulged thereby and the flatness of the wafer is remarkably reduced. It is also because higher resolving power is required year after year of exposing apparatus used for the manufacture of semiconductor elements. In the case of the projection exposure system, the portion bulged by foreign substances causes an out-of-focus condition to thereby cause the inconvenience that however good the resolving power of the projection optical system may be, a pattern of a desired line width cannot be exposed or the accuracy of superposition is not enhanced.

From such circumstances, the area of contact is made as small as possible with a view to reduce the probability of foreign substances being interposed.

In common exposing apparatus for microlithography a pattern formed on a negative called a reticule is uniformly irradiated with illuminating light from a high luminance light source (such as a mercury lamp or a laser) and the light transmitted therethrough is imaged on the resist (sensitive agent) of a photosensitive substrate such as a wafer through a projection optical system to thereby effect the transfer of the pattern. At this time, the resist is applied to the surface of the substrate at a predetermined thickness (0.8–2 µm) and a suitable exposure amount matching the transfer of the pattern is determined. The exposure amount is greatly varied depending on photosensitivity and in the reflectance of the substrate, even for a resist layer of the same thickness. In any case, most of exposing energy (chiefly ultraviolet ray) imparted to the photosensitive substrate is finally converted into thermal energy and diffused and accumulated in the substrate.

Particularly when a photosensitive substrate is to be exposed by the step and repeat system, even though the exposure time of one shot on a wafer exposed with one cycle of stepping is a short time (1 sec. or less), the exposing energy of the one shot is considerably high and amounts to 800 mW/cm$^2$ or greater on the wafer. Therefore, as the exposure of a wafer to each shot progresses, the heat accumulation in the photosensitive substrate also progresses, and thus, thermal deformation of the substrate occurs.

The thermal deformation results in the partial expansion and contraction of the substrate, and means that the superposition error of a shot area formed there and a pattern image to be superposed and exposed thereon increases. This superposition error is of the order of 10—30 nm and has heretofore been neglected because the total overlay accuracy has not been so strict, but the error becomes significant when the line width comes into a submicron area. Particularly, in the process of 16 MD-RAM and so on, the line width is of the order of 0.5 µm, and 50–70 nm or less is desired for the total overlay as well.

Accordingly, it becomes important to quickly exhaust the accumulated quantity of heat outwardly of the substrate in order to suppress the thermal deformation of the substrate. That is, it becomes necessary to cause the quantity of heat in the substrate to escape to the holder. For that purpose, it is also conceived to provide an active temperature control member such as a Peltier element within the holder or provide a structure for circulating temperature-controlled fluid in the holder, thereby quickly absorbing the quantity of heat in the substrate.

However, as previously described, the surface of the holder has been tendency to make the area of contact thereof with a substrate such as a wafer as small as possible, and there has been a disadvantage that the quantity of heat accumulated in the substrate is not quickly transferred to the holder side.

SUMMARY OF THE INVENTION

The present invention has as its object the provision of a holder which is improved in the heat transfer characteristic between it and a substrate and yet is reduced in the area of contact with the substrate and has a good flattening characteristic as well.

To achieve the above object, the substrate holder of the present invention is provided with two kinds of grooves (clearances) in the adsorbing surface thereof one kind of groove is made with a suitable depth so as to be able to quickly exhaust air and reduce pressure to effect vacuum mounting of the substrate, and the other kind of groove is formed with a very small depth within such a range that there is no influence of dust being interposed between the holder and the substrate, in order to better the heat conduction between the substrate and the substrate holder. In addition, the area of the latter is made large as compared with the area of the former.

Thus, in accordance with one of its principal aspects, the invention provides a substrate holder for holding a substrate, including a protruded portion for contacting with one surface of said substrate; a first clearance portion surrounded by said protruded portion; a second clearance portion of a wider area than said first clearance portion formed shallowly around said protruded portion; and pressure reducing means connected to said first clearance portion for evacuating said first clearance portion when said substrate is placed on said protruded portion.

The heat transfer in the groove portion is considered here. In a very narrow clearance of this kind, most of heat is transported by the heat conduction of air. If the spacing between the substrate and the surface of the substrate holder (the depth of the grooves) is d, the area of the groove portion is A, the heat conductivity of air is k and the temperature difference is ΔT, then the heat flow velocity q is expressed by the following equation:

$$q = -kA\Delta T/d \quad (1)$$

In a device of this kind, although called the mounting is referred vacuum mounting, pressure is usually reduced to the order of ⅓ to ⅒ relative to the atmospheric pressure, and within such a pressure range, k scarcely differs from the case of ordinary atmospheric pressure. Accordingly, k may be considered to be a constant which does not depend on pressure. As will be seen from equation (1), to increase q, it is effective to make the area A of the groove portion large and make the depth of the grooves small.

DESCRIPTION OF THE PREFERRED EMBODIMENTS

Figure 2:
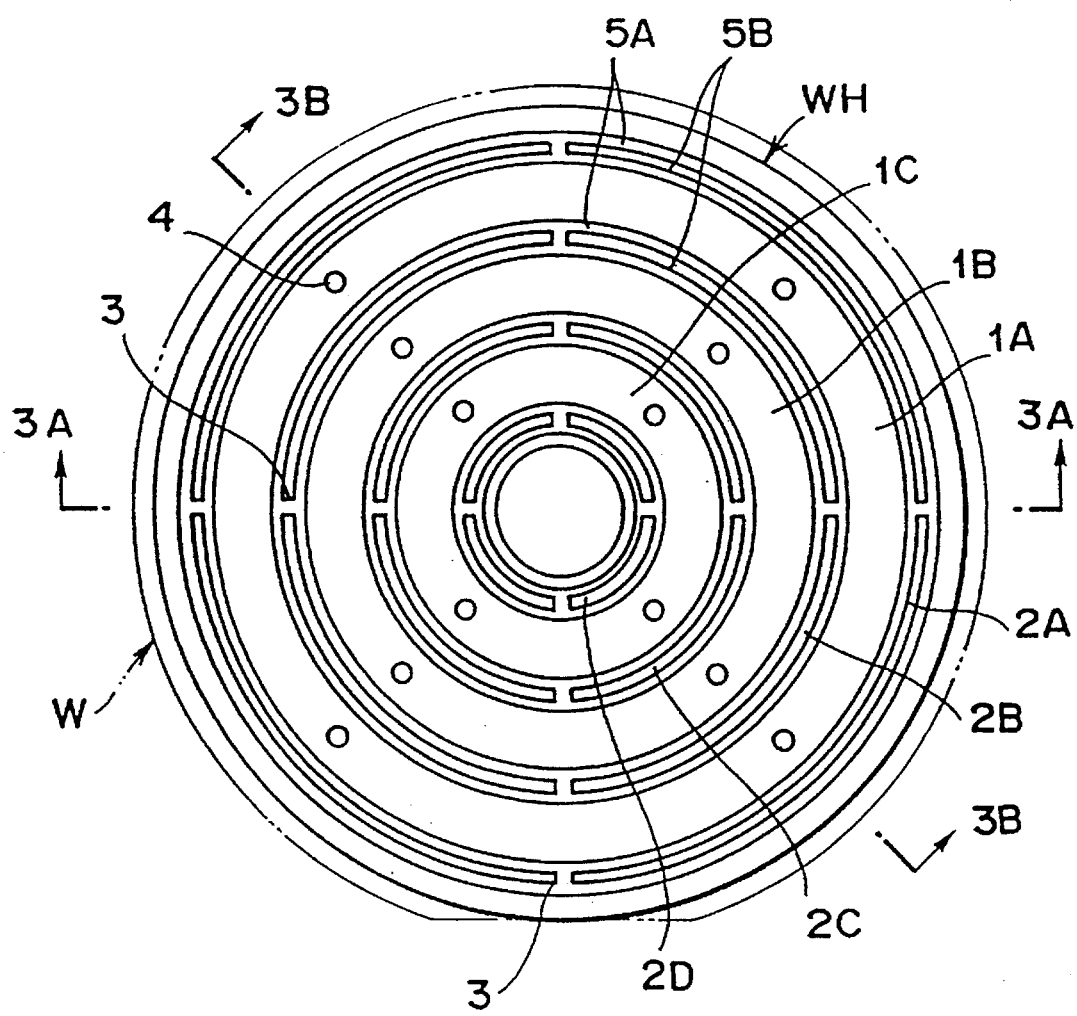
FIG. 2 is a plan view showing the surface structure of a holder according to a first embodiment of the present invention.
Figure 3A:
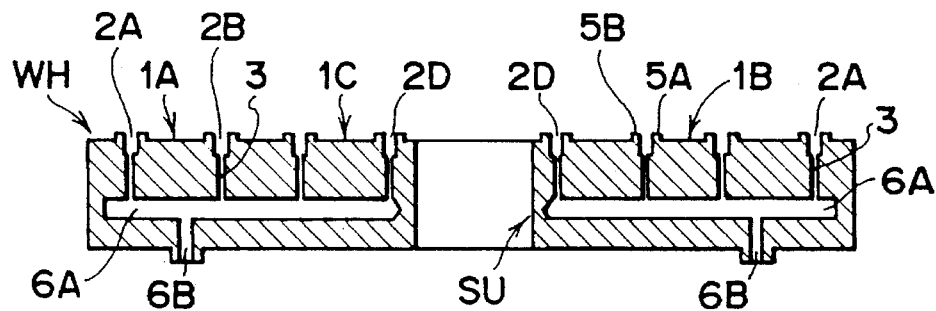
FIGS. 3A–3C are cross-sectional views showing the cross-sectional structure of the holder shown in FIG. 2.
Figure 3B:
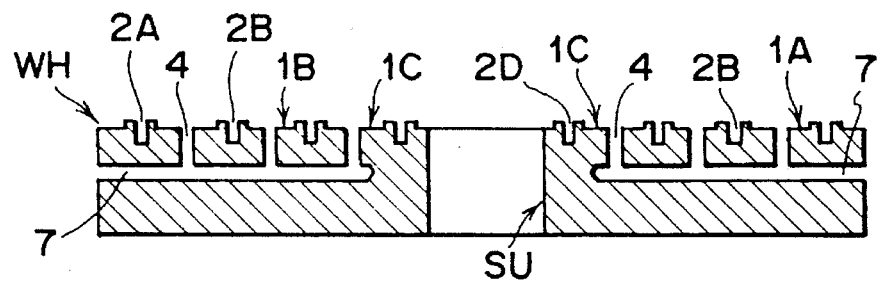
Figure 3C:
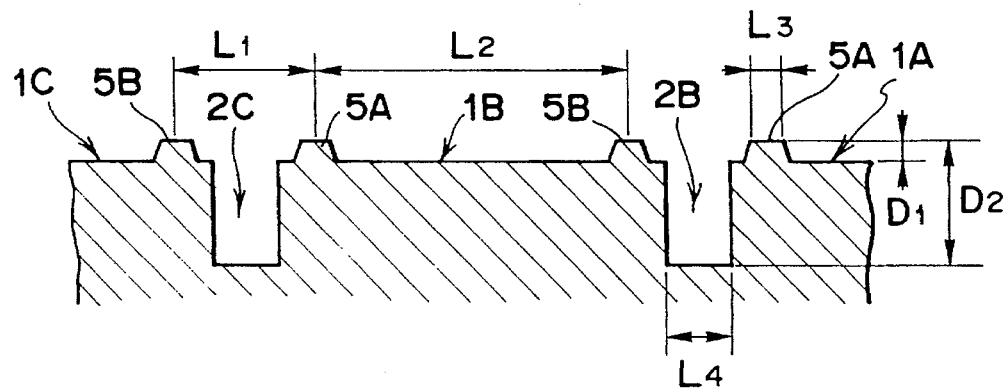

FIGS. 2 and 3A to 3C show a holder (WH) according to a first embodiment of the present invention, and more particularly, FIG. 2 shows the structure of the substrate supporting surface thereof, FIG. 3A shows a cross-section along the line 3A—3A of FIG. 2, and FIG. 3B shows a cross-section along the line 3B—3B of FIG. 2. FIG. 3C enlargedly shows a portion of the cross-sections shown in FIGS. 3A and 3B.

Referring to FIG. 2, four grooves for evacuation (relatively deep first clearance portions in the present invention) 2A, 2B, 2C and 2D are concentrically formed at predetermined intervals in the radial direction in the surface of a holder WH of a diameter slightly smaller than the configuration of a wafer W. Protruded portions 5A and 5B are formed with a slight height at both sides of each of these grooves 2A–2B. The depth of zonal portions (relatively shallow second clearance portions in the present invention) 1A, 1B and 1C formed between the protruded portion 5B inside a certain groove for adsorption (e.g. 2A) and the protruded portion 5A outside the inner groove for evacuation (e.g. 2B) is made smaller than the depth of the grooves 2A–2D for adsorption. Also, a plurality of intake holes 3 connected to a vacuum pressure reduction source are formed at suitable intervals inside the grooves 2A–2D for evacuation. A plurality of openings 4 are formed in each of the zonal portions 1A–1C formed as shallow grooves, and in the present embodiment, it is to be understood that the openings 4 are open to the atmosphere. As is apparent in FIG. 2, the radial dimension (width) of the zonal portions 1A–1C is made large relative to the radial dimension (width) of the grooves 2A–2D for evacuation, and the total of the areas of the zonal portions 1A, 1B and 1C is made sufficiently greater than the total of the areas of the grooves 2A–2D for evacuation.

Now, as shown in FIG. 3A, radially extending holes 6A for communicating with the intake holes 3 in the grooves 2A–2D for evacuation are formed in the interior of the holder WH, and these holes 6A in conjunction with the holes 3 define passages (second Passages) which communicate with connection ports 6B formed in the back side of the holder WH. Pipes from the vacuum pressure reduction source are connected to the connection ports 6B through electromagnetic valves or the like.

Further, as shown in FIG. 3B, radially extending holes 7 for communicating with the openings 4 in the zonal portions 1A–1C are formed in the interior of the holder WH, and these holes 7 extend through the side wall of the holder WH, and in conjunction with the holes 4, define passages (first passages) whereby the zonal portions 1A–1C are opened to the atmosphere.

When the back of the wafer W is drawn against the tip surfaces of the protruded portions 5A and 5B, the wafer W is to be brought to a flatness. Therefore, it is necessary that the tip surfaces of all the protruded portions 5A and 5B be worked in advance with uniform surface accuracy (e.g. the order of ±1 to 5 μm). Also, in a state in which the back of the wafer W is in contact with the protruded portions 5A and 5B, the grooves 2A–2B and zonal portions 1A–1C become closed clearances.

The surface structure of the holder WH will now be described in more detail with reference to FIG. 3C. First, the height D1 of the protruded portions 5A and 5B relative to the zonal portions 1A–1C is determined according to the size of dust (foreign substances) appearing in the environment wherein this holder WH is used as the reference. In the case of a holder for use in an exposing apparatus, the size of dust which will pose a problem is about 10 μm, and when larger dust is created, it means that the performance of a chamber for containing the apparatus body therein is questionable. There is also the possibility of dust being created, by the partial peeling of a resist layer applied to the wafer W. However, the thickness of the resist layer is about 1 μm on the surface of the wafer W, and is several μm at greatest on the edge portion of the wafer W. Therefore, it is almost always the case that even if peeling occurs over great dimensions, the thickness thereof will be 10 μm or less. So, in the present embodiment, the height D1 is chosen to 10 μm or greater, and preferably to about 20 μm with the workability taken into account. If the height D1 is thus chosen to 10 μm or greater, even if dust adhering to the back of the wafer W becomes interposed between the wafer and the zonal portions 1A–1C, the probability with which the surface side of the wafer W becomes bulged thereby will be very small. At the same time, the height D1 is as small as the order of 10–20 μm and therefore, the heat conduction between the zonal portions 1A–1C and the back of the wafer is maintained good.

Now, in contrast, the depth D2 of the grooves 2A–2D for evacuation (the depth as viewed from the tip surfaces of the protruded portions 5A and 5B) and the width L4 thereof is set with the range in which a good vacuum effect is accomplished and the workability taken into account. Considering from only the viewpoint of heat conduction, it is desirable that the depth D2 of the grooves 2A–2D be as shallow as the height D1. However, unless the depth D2 is set to a certain degree or greater, e.g. 100–200 μm or greater, there will arise the inconvenience that much time is required for the mounting of the wafer or unsatisfactory mounting is caused. This also holds true with respect to determining the width L4 of the grooves 2A–2D, and the practical value of the width L4 is the order of 0.2–2 mm. However, the depth D2 and width L4 somewhat differ depending on the arrangement and number of the intake holes 3 in the same groove and thus, actually, the optimum values thereof are determined by experiments or the like.

It is desirable for the purpose of reducing the area of contact that the radial width L3 of the tip surfaces of the protruded portions 5A and 5B be made as small as possible. Considered also from the viewpoint of workability, the width L3 is determined to the order of 0.1–1 mm. Also, when the width L3 of the protruded portions 5A and 5B and the width L4 of the grooves 2A–2D are determined, the interval L1 between the protruded portions 5A and 5B with the grooves 2A–2D interposed therebetween is also determined. From the above-described conditions, the interval L1 is of the order of 0.3–4 mm. On the other hand, the radial interval L2 between the inner annular protruded portion 5B with respect to the groove 2B and the outer annular protruded portion 5A with respect to the groove 2C, i.e., the substantial width of the zonal portion 1B, is determined to a value sufficiently greater than the width L1 of the grooves, and practically, it is set to the order of several mm to ten and several nun. The zonal portion 1B (as well as 1A and 1C) has a slight gap (D1) between it and the back of the wafer and therefore, if the width L2 of the zonal portion 1B is greater than necessary, the flattening correction of the wafer will be reduced. Also, the optimum value of the interval L2 differs depending on the thickness of the wafer, and therefore, it is desirable to determine it by experiments or the like. If the interval L2 is made as small as the interval L1, the problem of dust being interposed as a result of an increase in the area of contact and the problem of a reduction in heat conduction efficiency resulting from a decrease in the total area of the zonal portions will both become unsolvable.

Thus, as examples of numerical values for a wafer holder suitable for an 8-inch wafer, D1 =20 μm, D2=1 mm, L4=1 mm, L3=0.5 mm, L2=10 mm and L1=3 mm, whereby the expected effect can be obtained well.

It will be appreciated that when the height of the annular protruded portions 5A and 5B is of the order of 20 μm at greatest, only the protruded portions 5A and 5B may be attached afterward by the CVD method. Alternatively, the zonal portions 1A–1C may be finished to a desired depth (D1) by etching afterward. In the present embodiment, the zonal portions 1A–1C are open to the atmosphere through the openings 4, but alternatively, the zonal portions 1A–1C may be pressure-reduced. Because, the width L2 of the zonal portions 1A–1C is relatively great, if the zonal portions are evacuated excessively, the portions of the wafer which are opposed to the zonal portions 1A–1C may be curved by the correcting force (vacuum force). So, when the zonal portions 1A–1C are to be evacuated through the openings 4, it is desirable to make the pressure reduction small. Further, design may be made such that when the wafer is to be removed from the holder WH, compressed air is temporarily ejected from the openings 4 in the zonal portions 1A–1C.

Figure 4:
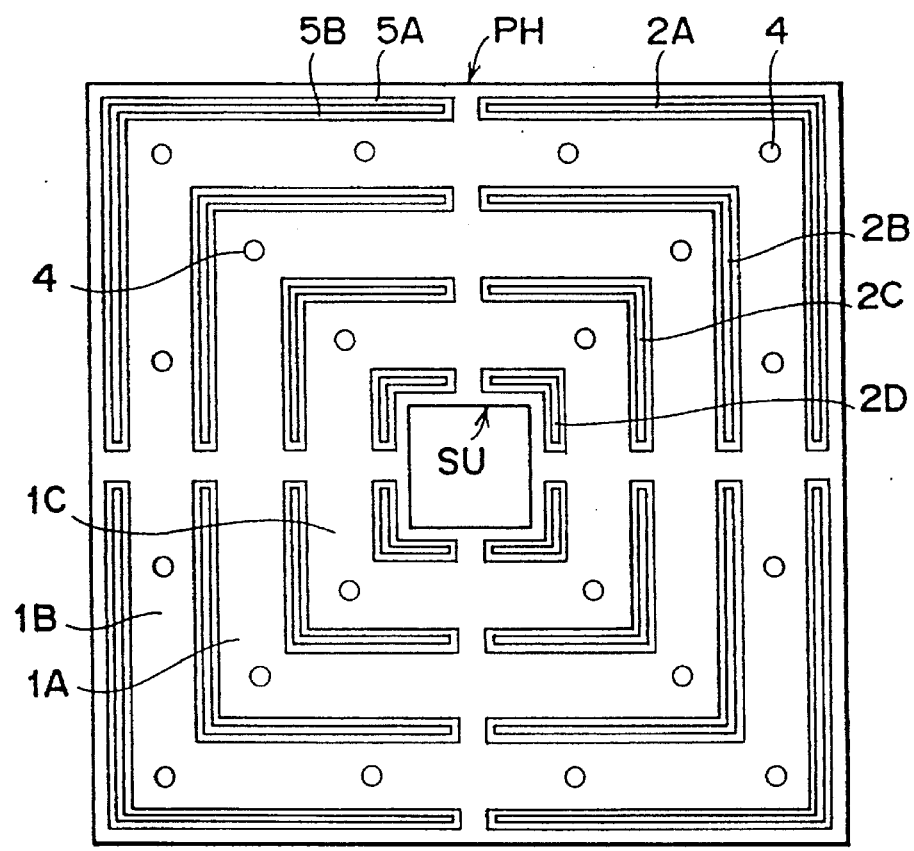
FIG. 4 is a plan view showing the surface structure of a holder according to a second embodiment of the present invention.

FIG. 4 shows the construction of a substrate holder according to a second embodiment, and particularly shows a case where the present invention is applied to a plate holder PH for vacuum mounting a square plate. In FIG. 4, L-shaped adsorption grooves 2A, 2B, 2C and 2D are surrounded by protruded portions 5A and 5B as in the previous embodiment. Although not shown in FIG. 4, intake holes 3 are formed in the grooves 2A–2D. Openings 4 for opening shallow groove portions 1A, 1B and 1C located between the L-shaped grooves 2A–2D to the atmosphere or weakly pressure-reducing the shallow groove portions 1A, 1B and 1C are formed at a plurality of locations in the shallow groove portions 1A, 1B and 1C. In the case of such a plate holder PH, the plate to be held by it has a thickness of the order of several mm and therefore, specific numerical values differ from those in the first embodiment, but the depth of the grooves 2A–2D is made greater than the depth of the groove portions 1A–1C, and the depth of the groove portions 1A–1C, i.e., the height of the protruded portions 5A and 5B, is determined with the size of dust taken into account.

Figure 1A:
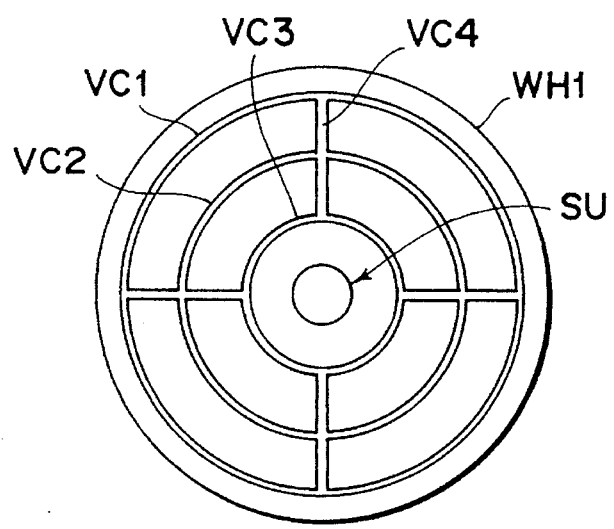
FIGS. 1A–1D show holders (wafer holders) according to the prior art.
Figure 1B:
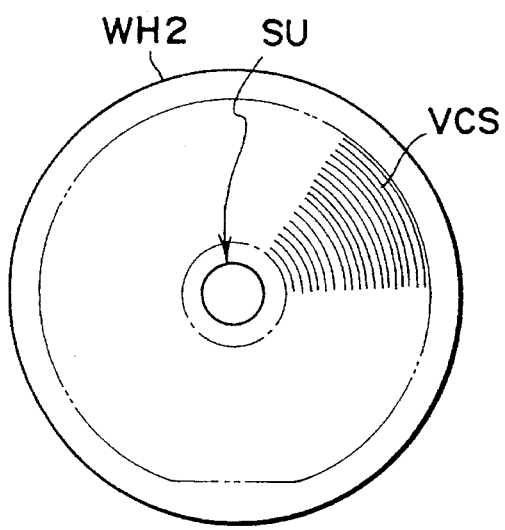
Figure 1C:
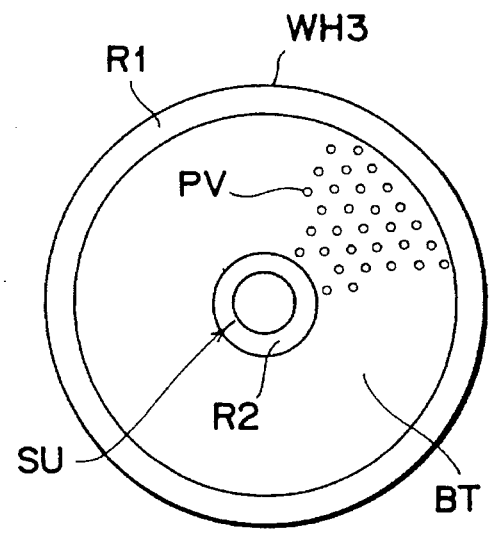
Figure 1D:
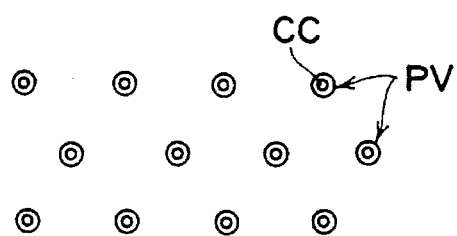
Figure 5A:
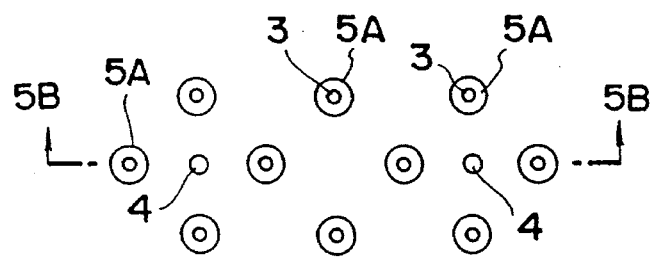
FIGS. 5A and 5B show the surface structure and cross-section, respectively, of a portion of a holder according to a third embodiment of the present invention.
Figure 5B:
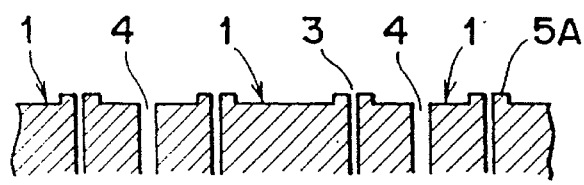

FIGS. 5A and 5B show the surface structure of a wafer holder according to a third embodiment, and this surface structure is basically similar to the surface structure of the prior art shown in FIG. 1D. FIG. 5A is a front view of a portion of the surface of the holder, and FIG. 5B is a cross-sectional view along the line 5B—5B of FIG. 5A. As shown in FIGS. 5A and 5B, a plurality of ring-like protruded portions 5A are formed at predetermined intervals on the surface 1 of the holder, and an intake hole 3 for evacuation is formed at the center of each of these protruded portions 5A. In the case of the wafer holder, the diameter of the ring-like protruded portions 5A is set to the order of 2–3 mm, and the pitch between the protruded portions is determined to the order of several mm to ten and several mm. Again in this embodiment, the tip surfaces of the ring-like protruded portions 5A contact with the back of a wafer, and therefore, the tip surface of each protruded portion 5A is finished so that the flatness thereof may be high.

Further, the height of the ring-like protruded portions 5A (the height from the surface 1 to the tip surface of the protruded portion 5A) is determined by the size of dust which may be created, as in the first embodiment.

Openings 4 for opening the slight clearance between the back of the wafer and the surface 1 to the atmosphere or weakly pressure-reducing the clearance are formed at a plurality of locations in the surface 1.

In the case of the present embodiment, there are no grooves for evacuation, but the present embodiment is of such structure that each of the intake holes 3 directly exerts a vacuum force on the back of the wafer. Therefore, the intake holes 3 may be considered to be equivalent to the grooves. Thus, the surface 1 formed shallowly from the tip surfaces of the ring-like protruded portions 5A corresponds to the zonal portions 1A–1C in FIGS. 2 and 3A to 3C, and the intake holes 3 formed more deeply than the surface 1 correspond to the grooves 2A–2D in FIGS. 2 and 3A to 3C.

The surface structure as shown in FIGS. 5A and 5B can be easily formed by etching or the like when the holder is made of a metal. Also, it can be preformed by a mold during sintering when the holder is made of ceramics.

As described above, according to the present invention, provision is made of two kinds of groove portions, i.e., groove (or hole) portions of a small area solely for evacuation to hold and the substrate and very shallow groove portions of a large area for the heat transfer between the substrate and the holder. Therefore, good heat transfer between the substrate and the holder is obtained without the function of vacuum mounting the substrate with good flatness being spoiled. This leads to the effect that the thermal deformation of the substrate is suppressed and good overlay accuracy is obtained.

Further, due to the good heat conduction, the quantity of heat conducted to the holder side is quickly absorbed when temperature controlling fluid is circulated through the holder, and this also leads to the advantage that the efficiency during temperature control becomes very high. In other words, the temperature of the temperature controlling fluid is quickly transmitted to the substrate side.

What is claimed is:

1. A substrate holder for holding a substrate, comprising:
    a base portion;
    a relatively deep first clearance portion extending into said base portion;
    protrusion means associated with said first clearance portion and fixedly protruded from a surface of said base portion for contacting a surface of the substrate, said protrusion means surrounding and defining an inlet region of said first clearance portion;
    a relatively shallow second clearance portion adjacent to said protrusion means, said second clearance portion having a greater area than said first clearance portion in a plane perpendicular to a depth direction of said first and second clearance portions;
    first passage means extending within said base portion for connecting said second clearance portion to the outside of the holder; and
    second passage means extending within said base portion for connecting said first clearance portion to a vacuum source.

2. A substrate holder according to claim 1, wherein said protrusion means includes first and second substantially annular, band-like protrusions formed parallel to each other, with said inlet region of said first clearance portion being disposed between said first and second protrusions; the substrate holder further includes a third substantially annular, band-like protrusion formed beside and parallel to one of said first and second protrusions; and said second clearance portion is disposed between said third protrusion and said one of said first and second protrusions.

3. In an exposure apparatus for printing a predetermined pattern image onto a photosensitive substrate, a substrate holder for holding the substrate, comprising:
    a base portion;
    a relatively deep first clearance portion extending into said base portion;
    protrusion means associated with said first clearance portion and fixedly protruded from a surface of said base portion for contacting a surface of the substrate, said protrusion means surrounding and defining an inlet region of said first clearance portion;
    a relatively shallow second clearance portion adjacent to said protrusion means, said second clearance portion having a greater area than said first clearance portion in a plane perpendicular to a depth direction of said first and second clearance portions;
    first passage means extending within said base portion for connecting said second clearance portion to the outside of the holder; and
    second passage means extending within said base portion for connecting said first clearance portion to a vacuum source;
    said photosensitive substrate being printed by the pattern image while said first clearance portion is subjected to evacuation.

4. A substrate holder for holding a substrate, comprising:
    a base portion;
    a plurality of relatively deep first clearance portions extending into said base portion;
    a plurality of protrusion means respectively associated with said plurality of first clearance portions and fixedly protruded from a surface of said base portion for contacting a surface of the substrate;
    each said protrusion means being elongated along said surface of said base portion and surrounding and defining an inlet region of the associated first clearance portion, and each having adjacent thereto a relatively shallow second clearance portion of greater area than the associated first clearance portion in a plane perpendicular to a depth direction of said first and second clearance portions; and passage means extending within said base portion for connecting each of said first clearance portions to a vacuum source.

5. A substrate holder according to claim 4, wherein the second clearance portion adjacent each protrusion means is connected to passage means extending within said base portion for connecting that second clearance portion to the outside of the holder when the substrate is placed on said plurality of protrusion means.

6. A substrate holder according to claim 4, wherein said plurality of protrusion means are substantially annular and parallel to one another.

7. A substrate holder according to claim 4, wherein said plurality of protrusion means are disposed in a concentric arrangement.

8. A substrate holder according to claim 3, wherein a height of said protrusion means is 10 to 20 μm.

9. A substrate holder according to claim 4, wherein a height of said protrusion means is 10 to 20 μm.

10. A substrate holder for holding a substrate, comprising:

a base portion;

a relatively deep first clearance portion extending into said base portion;

protrusion means associated with said first clearance portion and fixedly protruded from a surface of said base portion for contacting a surface of the substrate, said protrusion means surrounding and defining an inlet region of said first clearance portion, and a height of said protrusion means being 10 to 20 μm;

a relatively shallow second clearance portion adjacent to said protrusion means, said second clearance portion having a greater area than said first clearance portion in a plane perpendicular to a depth direction of said first and second clearance portions; and passage means extending within said base portion for connecting said first clearance portion to a vacuum source.

11. A substrate holder according to claim 10, wherein said second clearance portion is connected to passage means extending within said base portion and communicating between said second clearance portion and the outside of the holder.

12. A substrate holder according to claim 10, wherein said protrusion means includes a plurality of protrusions which are parallel to one another.

13. A substrate holder according to claim 12, wherein said protrusions are disposed in a concentric arrangement.

14. A substrate holder for holding a substrate, comprising:

a base portion;

a relatively deep first clearance portion extending into said base portion;

a protrusion portion associated with said first clearance portion and fixedly protruded from a surface of said base portion for contacting a surface of the substrate, said protrusion portion surrounding and defining an inlet region of said first clearance portion;

a relatively shallow second clearance portion adjacent to said protrusion portion, said second clearance portion having a greater area than said first clearance portion in a plane perpendicular to a depth direction of said first and second clearance portions;

a first passage extending within said base portion for connecting said second clearance portion to the outside of the holder; and a second passage extending within said base portion for connecting said first clearance portion to a vacuum source.

15. A substrate holder according to claim 14, wherein said protrusion portion includes first and second substantially annular, band-like protrusions formed parallel to each other, with said inlet region of said first clearance portion being disposed between said first and second protrusions; the substrate holder further includes a third substantially annular, band-like protrusion formed beside and parallel to one of said first and second protrusions; and said second clearance portion is disposed between said third protrusion and said one of said first and second protrusions.

16. In an exposure apparatus for printing a predetermined pattern image onto a photosensitive substrate, a substrate holder for holding the substrate, comprising:

a base portion;

a relatively deep first clearance portion extending into said base portion;

a protrusion portion associated with said first clearance portion and fixedly protruded from a surface of said base portion for contacting a surface of the substrate, said protrusion portion surrounding and defining an inlet region of said first clearance portion;

a relatively shallow second clearance portion adjacent to said protrusion portion, said second clearance portion having a greater area than said first clearance portion in a plane perpendicular to a depth direction of said first and second clearance portions;

a first passage extending within said base portion for connecting said second clearance portion to the outside of the holder; and a second passage extending within said base portion for connecting said first clearance portion to a vacuum source;

said photosensitive substrate being printed by the pattern image while said first clearance portion is subjected to evacuation.

17. A substrate holder according to claim 16, wherein a height of said protrusion portion is 10 to 20 μm.

18. A substrate holder for holding a substrate, comprising:

a base portion;

a plurality of relatively deep first clearance portions extending into said base portion;

a plurality of protrusion portions respectively associated with said plurality of first clearance portions and fixedly protruded from a surface of said base portion for contacting a surface of the substrate;

each said protrusion portion being elongated along said surface of said base portion and surrounding and defining an inlet region of the associated first clearance portion, and each having adjacent thereto a relatively shallow second clearance portion of greater area than the associated first clearance portion in a plane perpendicular to a depth direction of said first and second clearance portions; and passages extending within said base portion for connecting each of said first clearance portions to a vacuum source.

19. A substrate holder according to claim 18, wherein the second clearance portion adjacent each protrusion portion is connected to a passage extending within said base portion for connecting that second clearance portion to the outside of the holder.

20. A substrate holder according to claim 18, wherein said plurality of protrusion portions are substantially annular and parallel to one another.

21. A substrate holder according to claim 18, wherein said plurality of protrusion portions are disposed in a concentric arrangement.

22. A substrate holder according to claim 18, wherein a height of said protrusion portions is 10 to 20 μm.

23. A substrate holder for holding a substrate, comprising:

a base portion;

a relatively deep first clearance portion extending into said base portion;

a protrusion portion associated with said first clearance portion and fixedly protruded from a surface of said base portion for contacting a surface of the substrate, said protrusion portion surrounding and defining an inlet region of said first clearance portion, and a height of said protrusion portion being 10 to 20 μm;

a relatively shallow second clearance portion adjacent to said protrusion portion, said second clearance portion having a greater area than said first clearance portion in a plane perpendicular to a depth direction of said first and second clearance portions; and a passage extending within said base portion for connecting said first clearance portion to a vacuum source.

24. A substrate holder according to claim 23, wherein said second clearance portion is connected to a passage extending within said base portion and communicating between said second clearance portion and the outside of the holder.

25. A substrate holder according to claim 23, wherein said protrusion portion includes a plurality of protrusions which are parallel to one another.

26. A substrate holder according to claim 25, wherein said protrusions are disposed in a concentric arrangement.

* * * * *